US011917784B2

(12) United States Patent
Huang et al.

(10) Patent No.: US 11,917,784 B2
(45) Date of Patent: Feb. 27, 2024

(54) FIXING DEVICE

(71) Applicants: Inventec (Pudong) Technology Corporation, Shanghai (CN); INVENTEC CORPORATION, Taipei (TW)

(72) Inventors: Chi-Yu Huang, Taipei (TW); Hsu-Kai Tsai, Taipei (TW)

(73) Assignees: Inventec (Pudong) Technology Corporation, Shanghai (CN); INVENTEC CORPORATION, Taipei (TW)

(*) Notice: Subject to any disclaimer, the term of this patent is extended or adjusted under 35 U.S.C. 154(b) by 57 days.

(21) Appl. No.: 17/806,276

(22) Filed: Jun. 10, 2022

(65) Prior Publication Data

US 2023/0081766 A1 Mar. 16, 2023

(30) Foreign Application Priority Data

Sep. 10, 2021 (CN) ......................... 202111062267.X

(51) Int. Cl.
*H05K 1/02* (2006.01)
*H05K 1/14* (2006.01)
*H05K 7/06* (2006.01)

(52) U.S. Cl.
CPC ................. *H05K 7/06* (2013.01); *H05K 1/02* (2013.01); *H05K 1/141* (2013.01); *H05K 2201/09027* (2013.01); *H05K 2201/09063* (2013.01); *H05K 2201/09163* (2013.01); *H05K 2201/10409* (2013.01); *H05K 2201/10424* (2013.01); *H05K 2201/2018* (2013.01); *H05K 2201/2027* (2013.01)

(58) Field of Classification Search
CPC ............. H05K 1/02; H05K 7/06; H05K 1/141
See application file for complete search history.

(56) References Cited

U.S. PATENT DOCUMENTS 9,172,165 B1 * 10/2015 Sass ........................ G06F 1/185
2016/0037642 A1 * 2/2016 Takai .................. H05K 9/0015 361/720

* cited by examiner

*Primary Examiner* — Jeremy C Norris
(74) *Attorney, Agent, or Firm* — CKC & Partners Co., LLC

(57) ABSTRACT

A fixing device includes a circuit board, an insertion slot, and a fixing bracket. The circuit board has a peripheral recess, and the insertion slot is disposed on the circuit board. The fixing bracket is fixed in the peripheral recess, and the fixing bracket has a board, two lateral arms, and two guiding rails. The two lateral arms are connected to two corresponding sides of the board, and the two lateral arms are integrally formed from the board. In addition, the two guiding rails are respectively disposed at the two lateral arms, in which the two guiding rails extend towards the insertion slot.

15 Claims, 9 Drawing Sheets

100
110
130
170
170
170
193(190)
300
155 151 153
150
210
200

FIXING DEVICE

CROSS-REFERENCE TO RELATED APPLICATION

This application claims priority to China Application Serial Number, CN 202111062267.X, filed on Sep. 10, 2021, which are herein incorporated by reference in its entirety.

BACKGROUND

Field of Disclosure

The present disclosure relates to a fixing device. More particularly, the present invention relates to a fixing device for fixing an expansion unit to a printed circuit board (PCB).

Description of Related Art

As the big data generation coming, requirements of internet user gradually increase, and incorporations need to come up with new storage infrastructures for fulfilling requirements of massive data transportations and data processing, so as to build a storage hardware infrastructure which has reasonable cost for dealing with heterogeneous data. The Open Compute Project (OCP) has a purpose to build a hardware infrastructure for the open data center, and the defined server and chassis infrastructure can improve the efficiency and decrease the cost thereof. Motherboards of a server which adopt OCP infrastructure includes OCP expansion slot for expanding the calculation abilities, the storage abilities, and functions of the server. For instance, the OCP network insertion card provides flexible, reliable, and cost-efficient storage domain connection method for fulfilling the expansion requirements in future. In addition, the OCP 3.0 interface has become the current tendency since it can provide simple plugging and unplugging functions outside from the system.

Nevertheless, the circuit board used for carrying OCP network card receives a force and tends to bend and crack at the corner thereof due to the specification or the size requirements. Even when the OCP network card is assembled, the circuit board is prone to crack, and this situation leads to increase the cost of material, assembly, and manufacture.

As known from the above description, how to develop a fixing device which can improve the mechanical strength and stability of the circuit boards and provide installation convenience has become a critical problem to be fixed for the related industries.

SUMMARY

The invention provides a fixing device including a circuit board, an insertion slot, and a fixing bracket. The circuit board has a peripheral recess, and the insertion slot is disposed on the circuit board. The fixing bracket is fixed in the peripheral recess, and the fixing bracket has a board, two lateral arms, and two guiding rails. The two lateral arms are connected to two corresponding sides of the board, and the two lateral arms are integrally formed from the board. In addition, the two guiding rails are respectively disposed at the two lateral arms, in which the two guiding rails extend towards the insertion slot.

In some embodiments of the present invention, the board includes a plurality of ribs extending below the two lateral arms, and the ribs are spaced apart.

In some embodiments of the present invention, the board includes a plurality of ribs arranged in a crisscross pattern.

In some embodiments of the present invention, the fixing device comprises a plurality of fixing components, and the fixing bracket includes a plurality of protrusions. The protrusions are disposed at an outer edge of the two lateral arms, and the circuit board has a plurality of first through holes. Each of the protrusions includes a second through hole, and the fixing components respectively penetrate the first through holes and the second through holes aligned with the first through holes.

In some embodiments of the present invention, the fixing device of claim includes a latching structure, and the latching structure is configured to fix an expansion unit to the fixing bracket. The latching structure includes a fixing pillar and a rotating arm, and the rotating arm is configured to rotate and drive the fixing pillar to penetrate or move away from the guiding slot.

In some embodiments of the present invention, the fixing pillar includes a neck portion and a head portion. An end of the neck portion is rotatably connected to the rotating arm, and another end of the neck portion is connected to the head portion. A width of the head portion is greater than a width of the neck portion.

In some embodiments of the present invention, the latching structure has an elastic component, and the fixing bracket has a stopper. The neck portion penetrates the stopper, and the elastic portion is disposed between the head portion and the stopper.

In some embodiments of the present invention, the rotating arm has a first side and a second side adjacent to the first side, and the rotating arm is configured to rotate along a pivot such that the first side or the second side is in contact with the fixing bracket. A distance between the first side and the pivot is different from another distance between the second side and pivot.

In some embodiments of the present invention, the rotating arm further includes a chamfer between the first side and the second side.

In some embodiments of the present invention, one of the two lateral arms is disposed at the circuit board, and another one of the two lateral arms is disposed at a mechanical component.

Another aspect of the present invention relates to a fixing device including a circuit board, an insertion slot, a fixing bracket, and a latching structure. The circuit board has a peripheral recess, and the insertion slot is disposed on the circuit board. The fixing bracket is fixed in the peripheral recess, and the fixing bracket has a board, two lateral arms, and two guiding rails. The two lateral arms are connected to two corresponding sides of the board, and the two lateral arms are integrally formed from the board. In addition, the two guiding rails are respectively disposed at the two lateral arms, in which the two guiding rails extend towards the insertion slot. The latching structure is configured to fix an expansion unit to the fixing bracket, and the latching structure includes a fixing pillar and a rotating arm. The rotating arm is connected to the fixing pillar and configured to drive the fixing pillar to selectively penetrate the guiding slot.

In embodiments of the present invention, a fixing device includes a fixing bracket, and the fixing bracket includes a board and two lateral arms which are a continuous piece material with the board. When the fixing bracket is connected to the circuit board in the peripheral recess of the circuit board, the fixing bracket can stably support the circuit board and improve the mechanical strength of the circuit board. As such, when the circuit board receives a force, the fixing bracket can prevent the circuit board from being broken or cracked. Moreover, the board includes a plurality of ribs extending below the lateral arms, and the ribs which are spaced apart can efficiently support the two lateral arms and save deformation space, so as to prevent the fixing bracket from being broken and affected by heat expansion, cold contract, or force bending. The fixing device of the present invention further includes a latching structure, and the rotating arm of the latching structure is rotated to control the expansion unit which is inserted in the fixing device to be in a detachable state or a fixed state for a user to operate.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
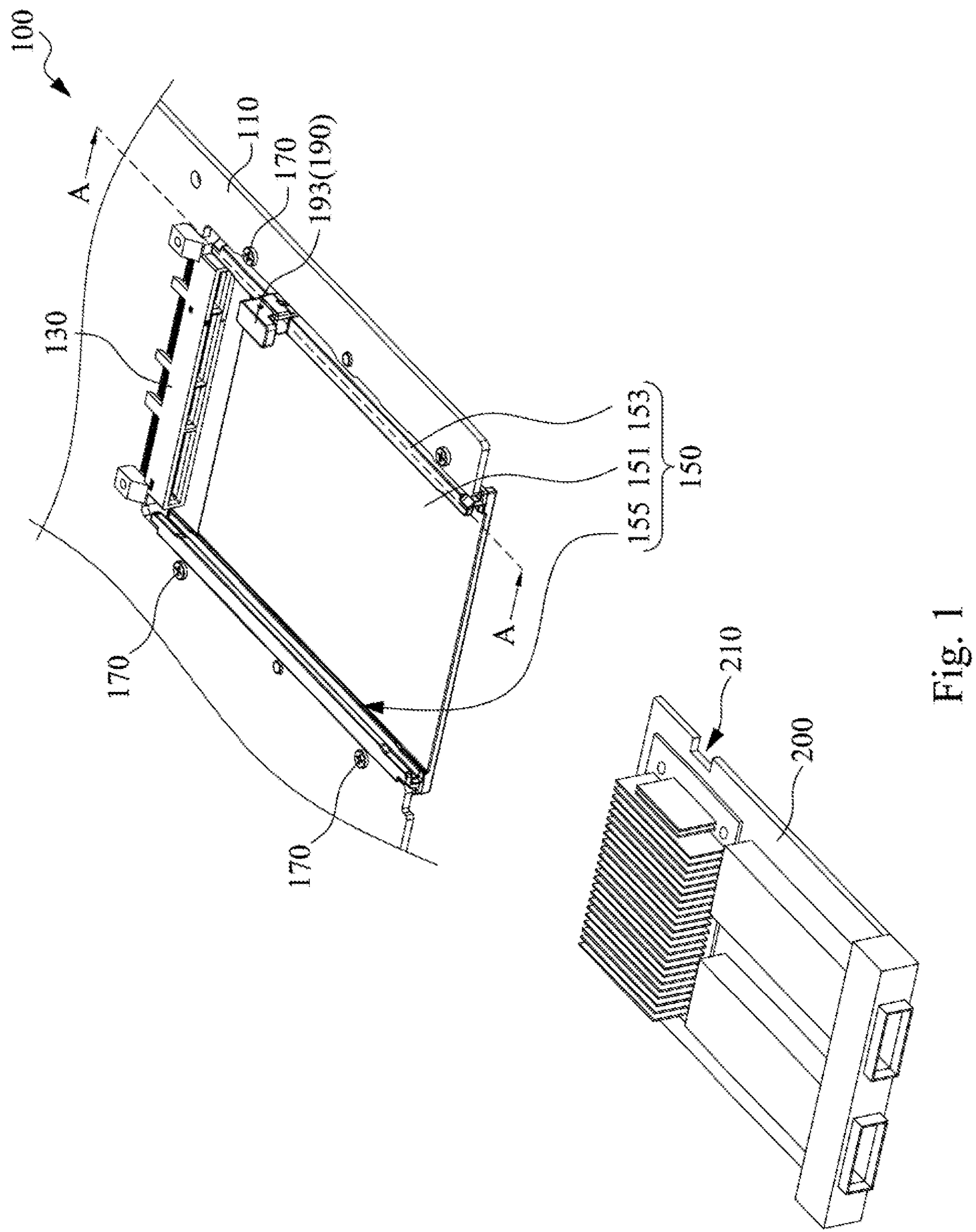
FIG. 1 is a schematic view of a fixing device in accordance with some embodiments of the present invention.
Figure 2:
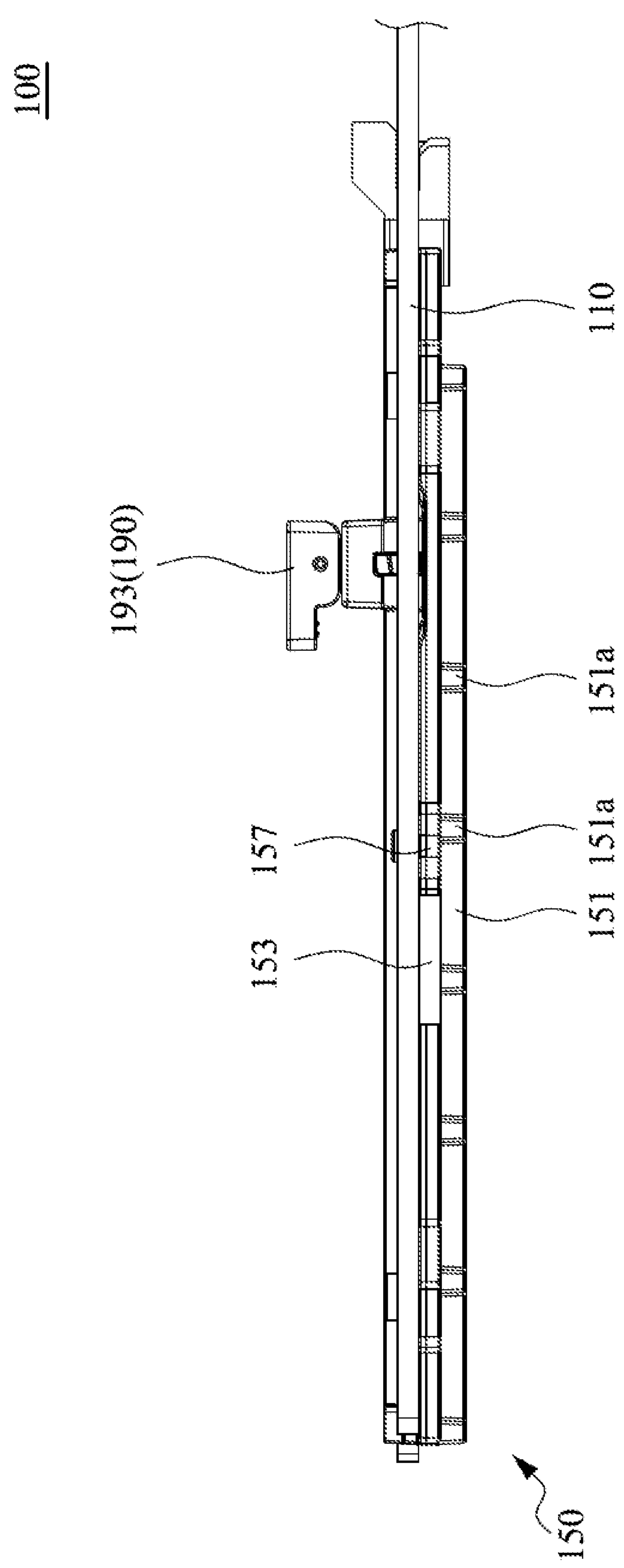
FIG. 2 illustrates a side view of a fixing device in accordance with some embodiments of the present invention.
Figure 3:
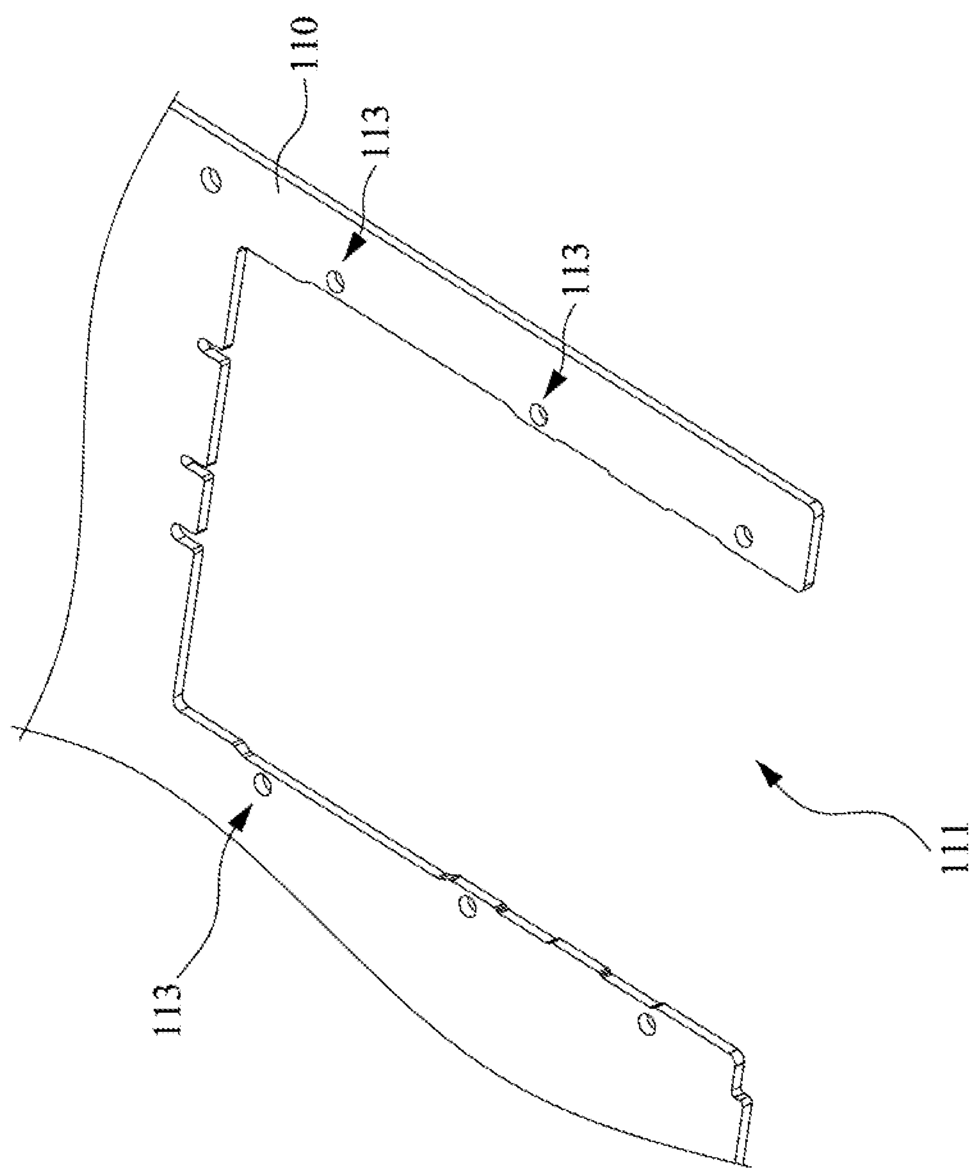
FIG. 3 illustrates a schematic view of a printed circuit board in accordance with some embodiments of the present invention.
Figure 4:
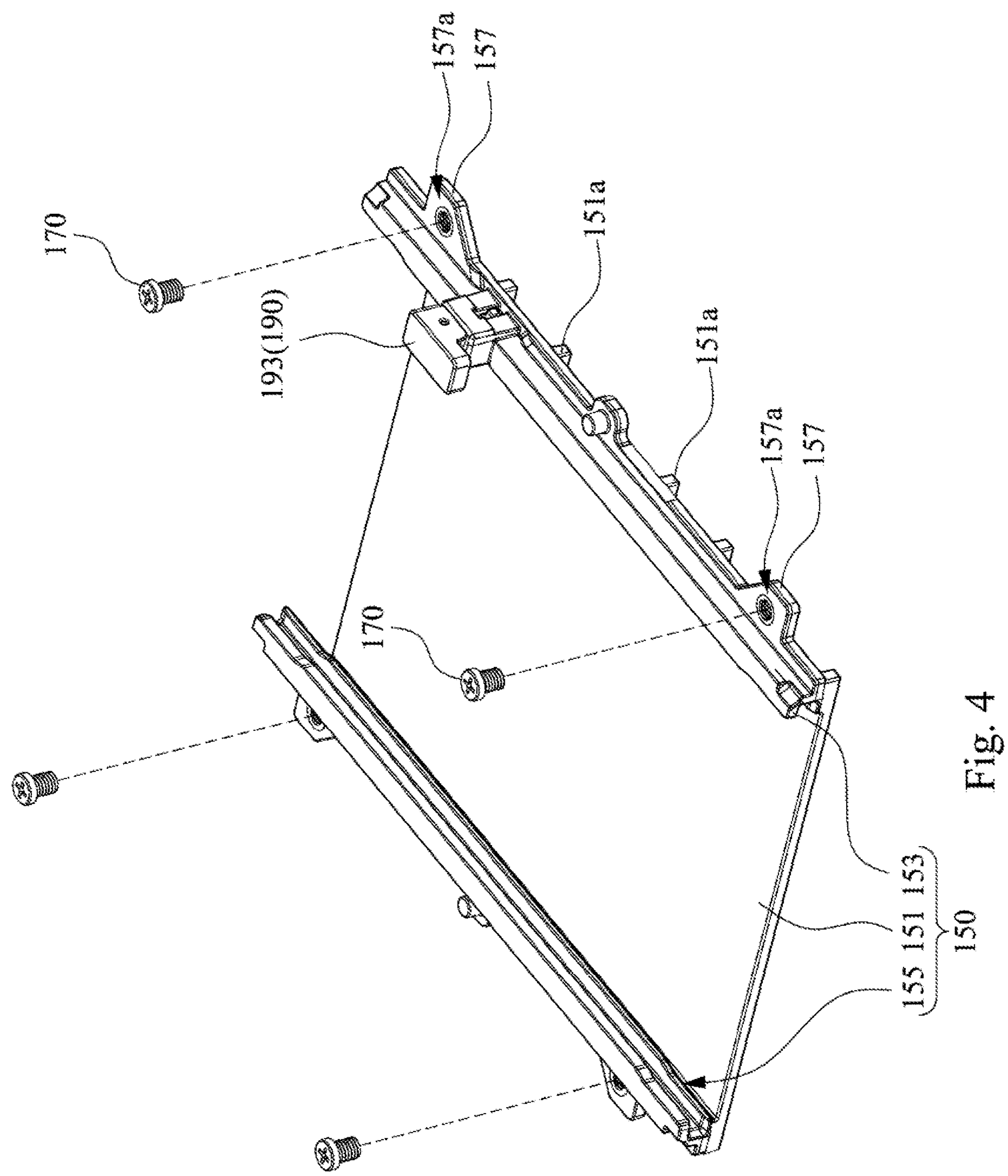
FIG. 4 illustrates a schematic view of a fixing bracket in accordance with some embodiments of the present invention.

Reference will now be made in detail to the present embodiments of the disclosure, examples of which are illustrated in the accompanying drawings. Wherever possible, the same reference numbers are used in the drawings and the description to refer to the same or like parts.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Please refer to FIGS. 1-4. In some embodiments of the present invention, a fixing device 100 includes a circuit board 110, an insertion slot 130, and a fixing bracket 150. The circuit board 110 has a peripheral recess 111, and the peripheral recess 111 adjoins an edge corner of the circuit board 110. The insertion slot 130 is disposed on the circuit board 110, and the fixing bracket 150 is fixed in the peripheral recess 111. The fixing bracket 150 has a board 151, two lateral arms 153, and two guiding slots 155. The two lateral arms 153 are respectively connected to two corresponding sides of the board 151 such as two opposite sides of the board 151, and the board 151 and the two lateral arms 153 are a continuous piece of material. In addition, the two lateral arms 153 are connected to two corresponding ends of the peripheral recess 111 of the circuit board 110, and the two guiding slots 155 are respectively disposed at the two lateral arms 153, in which the two guiding slots 155 extend toward the insertion slot 130. That is, an expansion unit 200 is inserted into the two guiding slots 155 of the fixing bracket 150, and the expansion unit 200 is able to move toward the insertion slot 130 or moving away from the insertion slot 130, so as to fix the expansion unit 200 to the circuit board 110 for joining the insertion slot 130 or detach the expansion unit 200 from the circuit board 110 and the insertion slot 130. Moreover, since the board 151 and the two lateral arms 153 are a continuous piece of material, the fixing bracket 150 can stably fix and support the circuit board 110 when the fixing bracket 150 is fixed to the peripheral recess 111, so as to improve the mechanical strength of the circuit board 110.

In some embodiments of the present invention, the circuit board 110 is a printed circuit board (PCB), and the printed circuit board can include a single sided board, a double sided board, or a multilayer board. The present invention is not limited in this respect. In addition, the insertion slot 130 is a network card interface insertion slot conforming Open Compute Project (OCP), so the insertion slot 130 can be an OCP 3.0 interface insertion slot. The expansion unit 200 can be a network conforming Open Compute Project (OCP), so the expansion unit 200 can be an OCP 3.0 network card. The present invention is not limited in this respect.

In some embodiments of the present invention, the fixing bracket 150 is a continuous piece of material manufactured by an injection molding process or an additive manufacturing process, and the fixing bracket 150 is made of a insulation material, such as polycarbonate (PC), polyethylene terephthalate (PET), polybutylene terephthalate (PBT), polypropene (PP), polyethylene naphthalate (PEN), polyamide (NYLON), and polytetrafluoroethylene (PTFE). The present invention is not limited in this respect. Since the fixing bracket 150 is made of the insulation material, the fixing bracket 150 can not only stably fix the expansion unit 200 to the circuit board 110 but also prevent the expansion unit 200 from short-circuiting.

In some embodiments of the present invention, the fixing device 100 further includes a plurality of fixing components 170, and the fixing bracket 150 further includes a plurality of protrusions 157 which are disposed at an outer edge of the two lateral arms 153. In addition, the circuit board 110 includes a plurality of first through holes 113, and each of the protrusions 157 includes a second through hole **157*a*. The fixing components 170 respectively penetrate the first through holes 113 and the second through holes 157*a* aligned with the first through holes 113. Specifically, the first through holes 113 are arranged in two symmetric straight lines, and the peripheral recess 111 is located between the two symmetric straight lines of the first through holes 113. Therefore, the fixing bracket 150 can be stably fixed to the circuit board 110 by the fixing components 170. In some embodiments of the present invention, the fixing components 170 are screws, and the first through holes 113 and the through holes 157*a* are threaded holes with the same interior diameters. The fixing components 170 simultaneously penetrate the first through holes 113 and the through holes 157***a* such that the expansion unit 200 is stably fixed to the circuit board 110 and the fixing bracket 150. The present invention is not limited in this respect.

Figure 5:
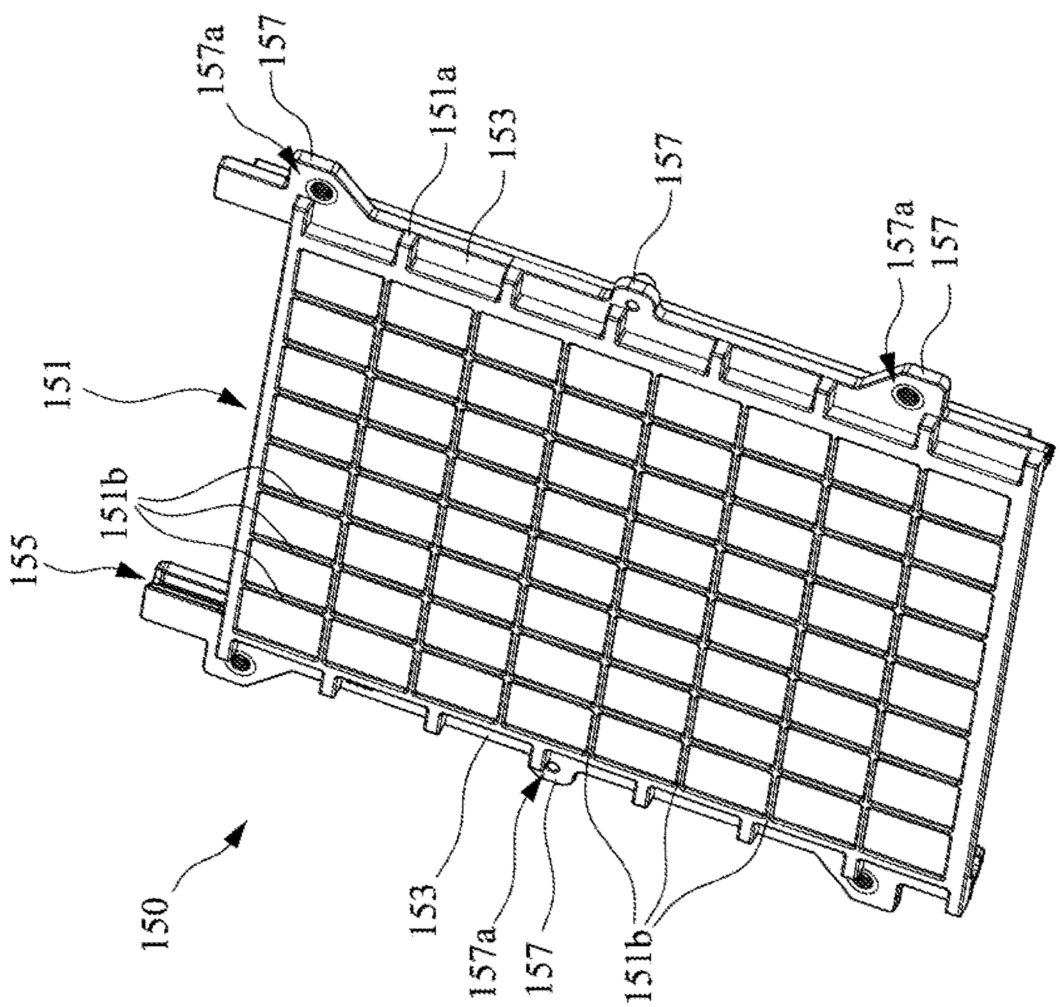
FIG. 5 illustrates the fixing bracket in a different viewpoint from FIG. 4.
Figure 6:
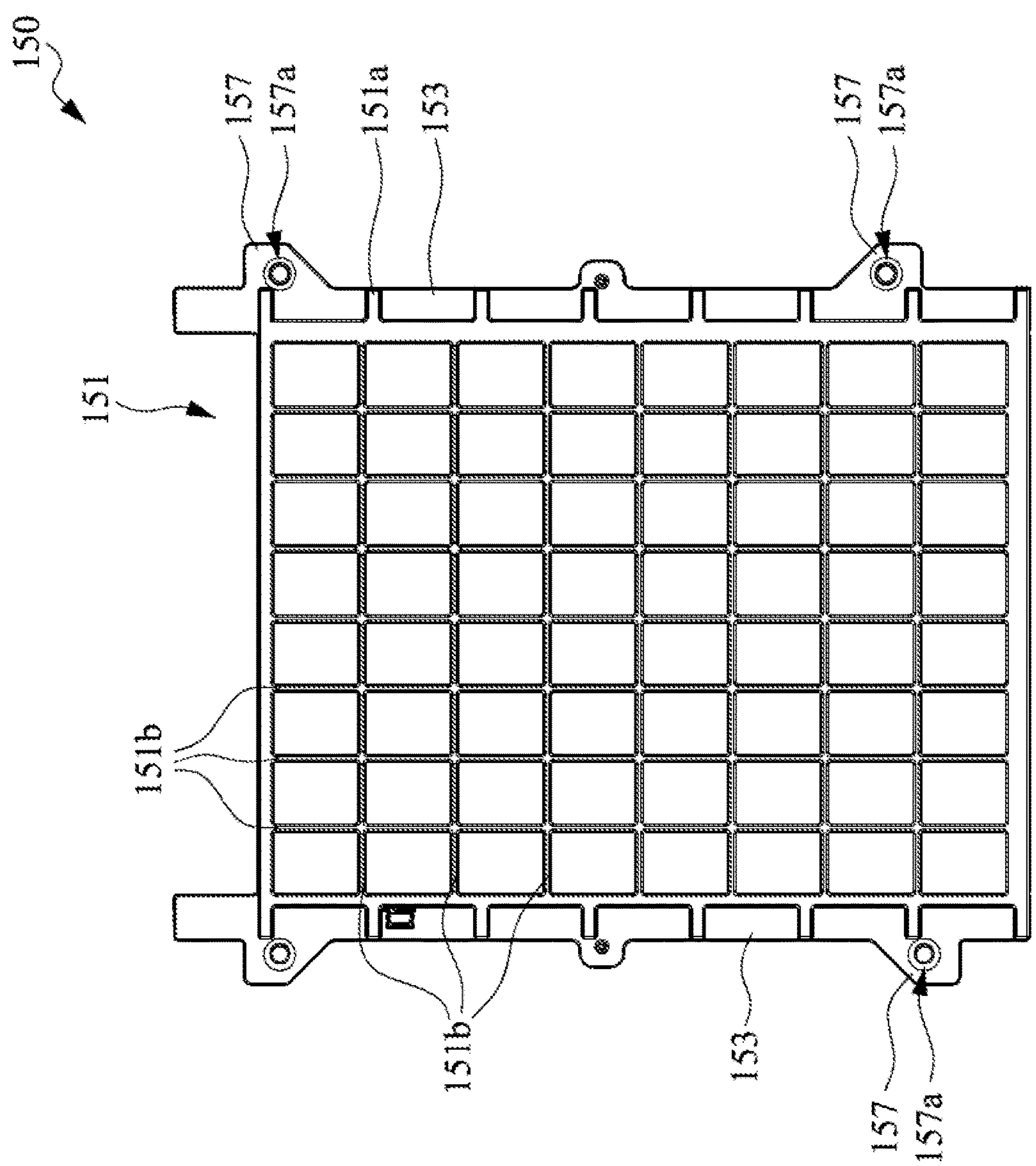
FIG. 6 illustrates a rear view of a fixing bracket in accordance with some embodiments of the present invention.

Reference is made to FIGS. 5 and 6. In some embodiments of the present invention, the board 151 has a plurality of ribs 151*a*, and the ribs 151*a* extend below the two lateral arms 153, in which the ribs 151*a* are spaced apart. Therefore, the ribs 151*a* can efficiently support the two lateral arms 153 and save deformation space, and the ribs 151*a* can prevent the fixing bracket 150 from being broken due to heat expansion, cold contract, or force bending. In addition, the board 151 further includes a plurality of ribs 151 which straightly extend and are arranged in a crisscross pattern, and the ribs 151*b* are locate at a bottom of the board 151. The vertically arranged ribs 151*b* are equally spaced, and the horizontally arranged ribs 151*b* are equally spaced such that the ribs 151*b* form a lattice pattern having a plurality of rectangles such as squares. The ribs 151*b* can evenly disperse an external force applied to the fixing bracket 150 for improving the mechanical strength of the fixing bracket 150. In some other embodiments, the ribs 151*b* curvedly extend, and immediately adjacent twos of the ribs 151*b* are spaced in different distances, and the present invention is not limited in this respect.

Figure 7:
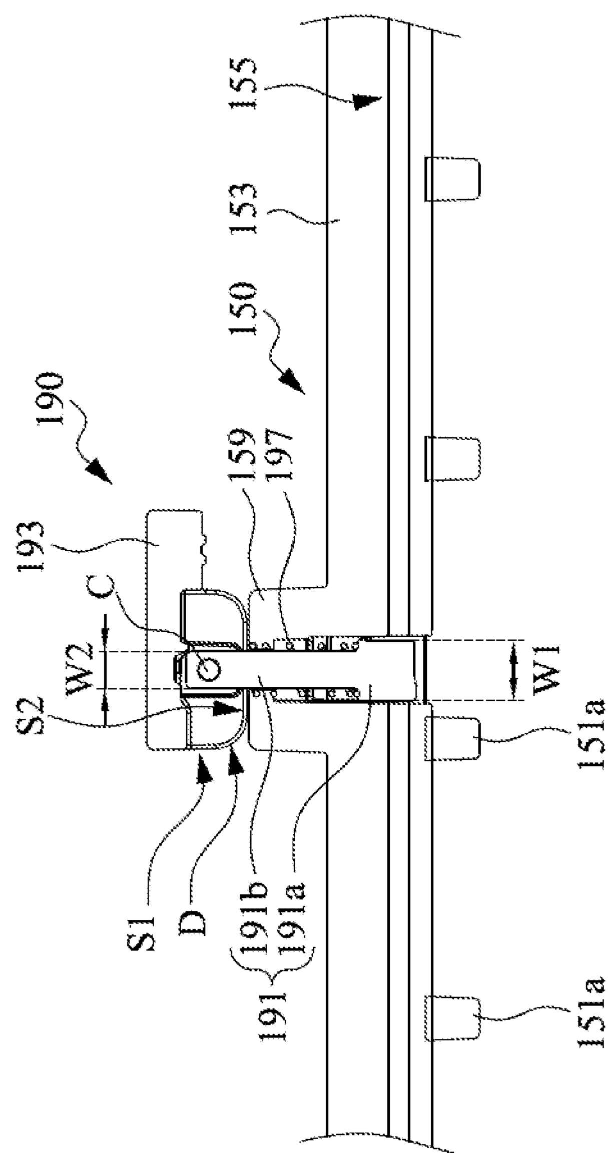
FIG. 7 illustrates a cross section view taken from the cross-section line A in FIG. 1.
Figure 8:
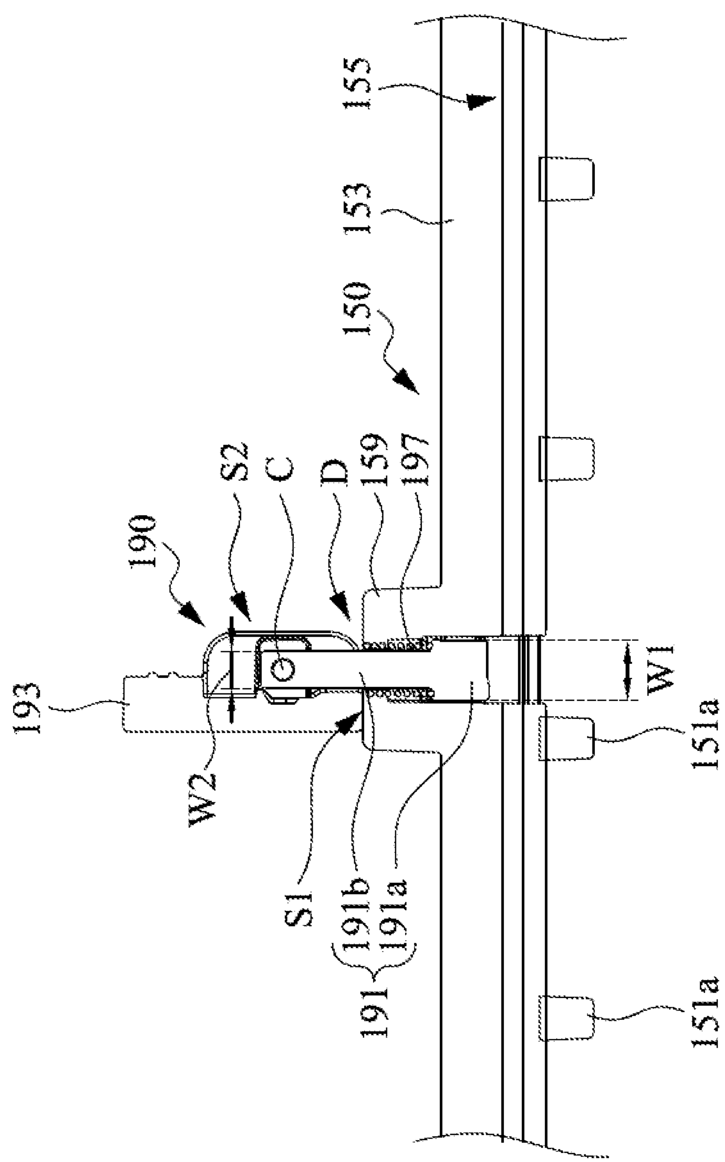
FIG. 8 illustrates a cross section view taken from the cross-section line A in FIG. 1, and the fixing bracket is in different states between FIG. 7 and FIG. 8.

Reference is made to FIGS. 7-8. In some embodiments of the present invention, the fixing device 100 includes a latching structure 190, in which the latching structure 190 enables the expansion unit 200 to selectively engage with the fixing bracket 150. The latching structure 190 includes a fixing pillar 191 and a rotating arm 193, and the rotating arm 193 rotates to drive the fixing pillar 191 to penetrate the guiding rail 155 or move away from the guiding rail 155. When the rotating arm 193 drives the fixing pillar 191 to penetrate the guiding rail 155, the fixing pillar 191 can also penetrate a notch 210 of the expansion unit 200 (referring to FIG. 1) such that the latching structure 190 can stably fix the expansion unit 200 to the fixing bracket 150. When the rotating arm 193 drives the fixing pillar 191 to move outside of the guiding rail 155, the expansion unit 200 moves toward or move away from the insertion slot 130 along the guiding rail 155 such that a user can enable the expansion unit 200 to join the insertion slot 130 or move outside of the insertion slot 130. By the configuration of the latching structure 190, a user can easily and efficiently install the expansion unit 200 to the insertion slot 130 and the fixing bracket 150, so the latching structure 190 can provide excellent assembly convenience and practicality.

In some embodiments of the present invention, the fixing pillar 191 includes a head portion 191*a* and a neck portion 191*b*, and an end of the neck portion 191*b* is rotatably connected to a pivot C of the rotating arm 193. Another end of the neck portion 191*b* is connected to the head portion 191*a*, and the head portion 191*a* has a width W1 greater than a width W2 of the neck portion 191*b*. In addition, the head portion 191*a* can be cone-shaped, cube-shaped, or cylinder-shaped, and the present invention is not limited in this respect. In some embodiments of the present invention, the latching structure 190 includes an elastic component 197, and the fixing bracket 150 includes a stopper 159. The neck portion 191*b* penetrates the stopper 159, and the elastic component 197 is disposed between the head portion 191*a* and the stopper 159. In some embodiments of the present invention, when the elastic component 197 is pressed to deform, the elastic component 197 continuously applies a force in a direction facing the guiding rail 155 to the head portion 191*a* such that the fixing pillar 191 tends to penetrate the insertion slot 130. Specifically, the elastic component 197 can be a spring sleeved at the neck portion 191*b*, and the elastic component 197 can also be an elastic sheet or an elastic rubber. The present invention is not limited in this respect. The head portion 191*a* and the stopper 159 are configured to limit the elastic component 197 at the neck portion 191*b*, and the width W1 of the head portion 191*a* enables the head portion 191*a* to be stuck at the stopper 159, so as to prevent the fixing pillar 191 from dropping from the fixing bracket 150.

In some embodiments of the present invention, the rotating arm 193 includes a first side S1 and a second side S2 substantially vertical to the first side S1, and the rotating arm 193 rotates along the pivot C to be in contact with the fixing bracket 150 via the first side S1 or the second side S2, and a shortest distance between the pivot C and the first side S1 is different from another shortest distance between the pivot C and second side S2. In comparison between FIG. 7 and FIG. 8, when the second side S2 is contact with the fixing bracket 150, the pivot C is closer to the guiding rail 155 such that the fixing pillar 191 which is connected to the pivot C penetrates the guiding rail 155 at the same time. On the other hand, when the first side S1 is in contact with the fixing bracket 150, the pivot C is farther from the guiding rail 155 such that the fixing pillar 191 which is connected to the pivot C is separated from the guiding rail 155. As such, when the rotating arm 193 rotates to different angles, the rotating arm 193 enables the fixing pillar 191 to penetrate the guiding rail 155 or move away from the guiding rail 155, so as to make the expansion unit 200 of the fixing bracket 150 in a locked state or a detachable state. In addition, the first side S1 is substantially vertical to the second side S2, and the fixing pillar 191 is driven to penetrate or move away from the guiding rail 155 when the rotating arm 193 rotates about 90 degrees. In some embodiments of the present invention, the rotating arm 193 includes a chamfer D, and the chamfer D is disposed between the first side S1 and the second side S2, in which the first side S1 and the second side S2 collectively form the chamfer D. The chamfer D is benefit for a user to efficiently operate the rotating arm 193 to rotate along the pivot C, and the chamfer D can prevent the fixing bracket 150 from being stuck with the rotating arm 193.

Figure 9:
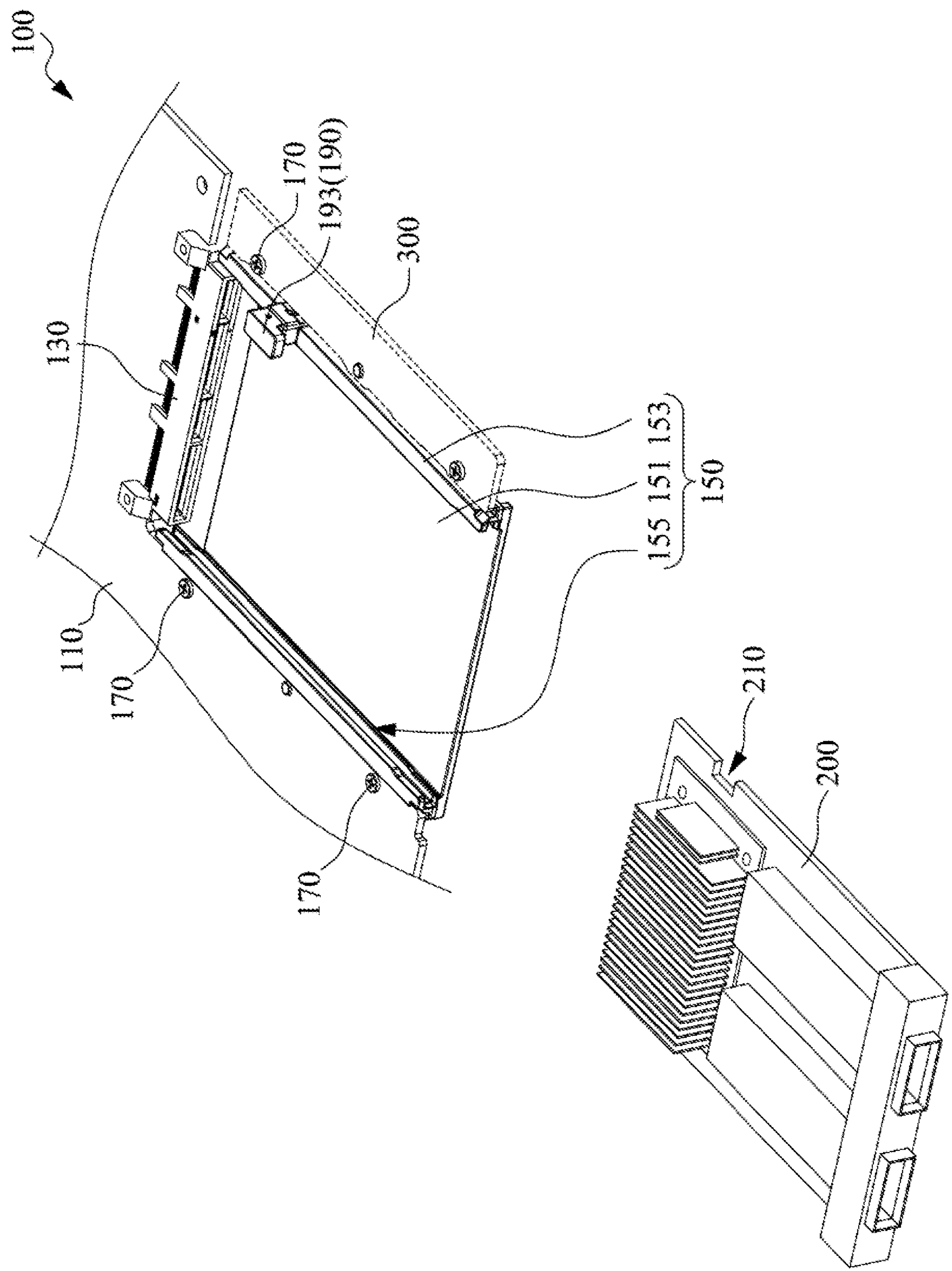
FIG. 9 illustrates a schematic view of a fixing device in accordance with some embodiments of the present invention.

Reference is made to FIG. 9. In some embodiments of the present invention, the fixing device 100 is directly fixed to a mechanical component 300, and the mechanical component 300 can be a part of a chassis such as board of server chassis and other structures. Specifically, a lateral arm 153 of the fixing bracket 150 is locked to the L-shaped circuit board 110, and another lateral arm 153 of the fixing bracket 150 is locked to the mechanical component 300. The mechanical component 300 includes a plurality of through holes (nor shown) respectively aligned with the through holes 157*a* (referring to FIGS. 4-6) such that the fixing component 170 can install the fixing bracket 150 to the mechanical component 300. Since the fixing bracket 150 is directly locked to the circuit board 110 and the mechanical component 300, the mechanical component 300 can support the circuit board 110 and the fixing bracket 150, so as to improve the whole mechanical strength thereof after being assembled.

In embodiments of the present invention, a fixing device includes a fixing bracket, and the fixing bracket includes a board and two lateral arms which are a continuous piece material with the board. When the fixing bracket is connected to the circuit board in the peripheral recess of the circuit board, the fixing bracket can stably support the circuit board and improve the mechanical strength of the circuit board. As such, when the circuit board receives a force, the fixing bracket can prevent the circuit board from being broken or cracked. Moreover, the board includes a plurality of ribs extending below the lateral arms, and the ribs which are spaced apart can efficiently support the two lateral arms and save deformation space, so as to prevent the fixing bracket from being broken and affected by heat expansion, cold contract, or force bending. The fixing device of the present invention further includes a latching structure, and the rotating arm of the latching structure is rotated to control the expansion unit which is inserted in the fixing device to be in a detachable state or a fixed state for a user to operate.

In embodiments of the present invention, a circuit board of the server can adopt the fixing device of the present invention to improve the structural strengthen of the OCP expansion insertion slot, so as to expend the calculation and storage ability of the server. Therefore, the server is suitable for operating Artificial Intelligence or Edge Computing, and the server can also be adopted as 5G server, could server, or car network server.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A fixing device, comprising:

a circuit board having a peripheral recess;

an insertion slot disposed on the circuit board; and a fixing bracket fixed in the peripheral recess, and the fixing bracket has a board, two lateral arms, and two guiding rails, the two lateral arms are connected to two corresponding sides of the board, wherein the two lateral arms and the board are a continuous piece of material, the two guiding rails are respectively disposed at the two lateral arms, and the two guiding rails extend towards the insertion slot.

2. The fixing device of claim 1, wherein the board includes a plurality of ribs extending below the two lateral arms, and the ribs are spaced apart.

3. The fixing device of claim 1, wherein the board includes a plurality of ribs arranged in a crisscross pattern.

4. The fixing device of claim 1, further comprising a plurality of fixing components, wherein the fixing bracket includes a plurality of protrusions, the protrusions are disposed at an outer edge of the two lateral arms, and the circuit board has a plurality of first through holes, each of the protrusions includes a second through hole, and wherein the fixing components respectively penetrate the first through holes and the second through holes aligned with the first through holes.

5. The fixing device of claim 1, further comprising a latching structure, wherein the latching structure is configured to fix an expansion unit to the fixing bracket, and the latching structure comprises:

a fixing pillar; and a rotating arm configured to rotate and drive the fixing pillar to penetrate or move away from the guiding slot.

6. The fixing device of claim 5, wherein the fixing pillar comprises a neck portion and a head portion, an end of the neck portion is rotatably connected to the rotating arm, and another end of the neck portion is connected to the head portion, and wherein a width of the head portion is greater than a width of the neck portion.

7. The fixing device of claim 6, wherein the latching structure has an elastic component, the fixing bracket has a stopper, wherein the neck portion penetrates the stopper, and the elastic portion is disposed between the head portion and the stopper.

8. The fixing device of claim 6, wherein the rotating arm has a first side and a second side adjacent to the first side, the rotating arm is configured to rotate along a pivot such that the first side or the second side is in contact with the fixing bracket, and wherein a distance between the first side and the pivot is different from another distance between the second side and pivot.

9. The fixing device of claim 6, wherein the rotating arm further comprises a chamfer disposed between the first side and the second side.

10. The fixing device of claim 1, wherein one of the two lateral arms is disposed at the circuit board, and another one of the two lateral arms is disposed at a mechanical component.

11. A fixing device, comprising:

a circuit board having a peripheral recess;

an insertion slot disposed on the circuit board;

a fixing bracket fixed in the peripheral recess, and the fixing bracket has a board, two lateral arms, and two guiding rails, the two lateral arms are connected to two corresponding sides of the board, wherein the two lateral arms and the board are a continuous piece of material, the two guiding rails are respectively disposed at the two lateral arms, and the two guiding rails extend towards the insertion slot; and a latching structure configured to fix an expansion unit to the fixing bracket, and the latching structure comprises:

a fixing pillar; and a rotating arm connected to the fixing pillar and configured to drive the fixing pillar to selectively penetrate the guiding slot.

12. The fixing device of claim 11, wherein the fixing pillar comprises a neck portion and a head portion, an end of the neck portion is rotatably connected to the rotating arm, and another end of the neck portion is connected to the head portion, and wherein a width of the head portion is greater than a width of the neck portion.

13. The fixing device of claim 12, wherein the latching structure has an elastic component, the fixing bracket has a stopper, wherein the neck portion penetrates the stopper, and the elastic portion is disposed between the head portion and the stopper.

14. The fixing device of claim 12, wherein the rotating arm has a first side and a second side adjacent to the first side, the rotating arm is configured to rotate along a pivot such that the first side or the second side is in contact with the fixing bracket, and wherein a distance between the first side and the pivot is different from another distance between the second side and pivot.

15. The fixing device of claim 12, wherein the rotating arm further comprises a chamfer disposed between the first side and the second side.

* * * * *